United States Patent [19]

Taylor

[11] 4,061,829

[45] Dec. 6, 1977

[54] NEGATIVE RESIST FOR X-RAY AND ELECTRON BEAM LITHOGRAPHY AND METHOD OF USING SAME

[75] Inventor: Gary Newton Taylor, Fanwood, N.J.

[73] Assignee: Bell Telephone Laboratories, Incorporated, Murray Hill, N.J.

[21] Appl. No.: 680,156

[22] Filed: Apr. 26, 1976

[51] Int. Cl.$^2$ ............................................. B05D 3/06
[52] U.S. Cl. ..................................... 428/451; 96/35.1; 96/36.2; 96/115 P; 250/492 A; 427/43
[58] Field of Search ........................ 427/43, 36, 17, 53; 526/291, 292; 250/492 R, 492 A; 96/35.1, 36.2, 115 R, 115 P; 428/451

[56] References Cited

U.S. PATENT DOCUMENTS

| | | | |
|---|---|---|---|
| 3,418,301 | 12/1968 | Spivey | 526/292 |
| 3,480,600 | 11/1969 | Pumpelly et al. | 526/292 |
| 3,515,656 | 6/1970 | Huang et al. | 526/292 |
| 3,563,809 | 2/1971 | Wilson | 427/43 |
| 3,867,318 | 2/1975 | Nishikubo et al. | 526/292 |
| 3,987,215 | 10/1976 | Cortellino | 427/43 |

OTHER PUBLICATIONS

Thompson et al., J. Electrochemical Soc., vol. 121, Nov. 1974 pp. 1500-1503.

*Primary Examiner*—John H. Newsome
*Attorney, Agent, or Firm*—George S. Indig

[57] ABSTRACT

A class of chlorinated or brominated polymeric negative resists for high resolution X-ray or electron lithographic processes is described. Chlorine and bromine atoms have a generally high mass absorption coefficient for X-rays and can be incorporated into the polymer in high weight percents. The chlorinated resists are especially sensitive to the 4.37 Angstrom characteristic X-rays from a Pd target.

41 Claims, No Drawings

NEGATIVE RESIST FOR X-RAY AND ELECTRON BEAM LITHOGRAPHY AND METHOD OF USING SAME

BACKGROUND OF THE INVENTION

1. Field of the Invention

This invention relates generally to the production of high resolution patterned images and more specifically to the production of high resolution patterned images with polymeric materials which crosslink upon exposure to X-ray or electron radiation.

2. Description of the Prior Art

The production of high resolution patterned images used in the fabrication of miniaturized circuits of devices depends upon the exposure of portions of a resist coated substrate to radiation, e.g., visible light or electrons, which initiates reactions causing the exposed material to become either more or less easily removed with respect to the unexposed material when processed by suitable wet or self development techniques that will be referred to as developers. The exposure may be with a scanning radiation source that sequentially illuminates selected portions of the resist material or with a radiation source that exposes all of a mask transparent to the radiation but covered with a pattern formed by a material opaque to the radiation thus causing selected portions of the resist material to be illuminated. For polymeric materials, the reactions are predominantly crosslinking or chain scission. The former causes the exposed material to become less soluble and the latter more soluble, with respect to the unexposed material, when exposed to a suitable developer. Following photographic terminology, the resists are commonly referred to as negative and positive, respectively. After portions of the resist are removed by development, the now bored substrate portions may be subjected to further processing steps which may remove the substrate by techniques such as chemical etching; plasma etching or ion milling or deposit material by techniques such as ion implantation or diffusion. The processing sequence may be repeated several times, i.e., the crosslinked resist is stripped off, a new resist coating is put down and the processing sequence repeated.

The high energy and short wavelength of electron and X-ray radiation permit the generation of very high resolution patterns. However, the high speed, high resolution negative electron polymeric resists are not entirely suitable as X-ray resists because, while the polymer absorbs an appreciable fraction of the incident electron radiation, the polymer usually does not absorb an appreciable fraction of the incident X-ray energy. A class of high sensitivity and resolution negative electron resists incorporates highly reactive epoxy groups onto polymer side chains to initiate crosslinking. The crosslinking reaction for both electron and X-ray radiation is believed initiated by absorption of the incident radiation, typically by K or L shell absorption, followed by ejection of a high energy electron which may produce other excited electrons. Either, or both, the incident radiation or an excited electron ultimately causes crosslinking via the reactive epoxy group. Since the crosslinking reactions are initiated by absorbed radiation, the smaller absorption for X-rays of polymers containing mainly first and second row elements generally decreases sensitivity compared with sensitivity to electron radiation. Because of the similarity of the processes leading to crosslinking, it has been proposed, *J. Electrochem Soc.* 121 1500 (1974), to increase the relatively low X-ray absorption and sensitivity X-ray resists by incorporating atoms having high atomic numbers and X-ray absorption into the resist. Poly(vinyl ferrocene) was mentioned as illustrative. Another X-ray resist uses metal containing compositions such as barium lead acrylate in an amorphous state to increase X-ray absorption.

SUMMARY OF THE INVENTION

A class of halogenated homopolymers and copolymers with pendent halogenated alkyl groups and sufficient sensitivity to be used as either electron or X-ray negative resists for the generation of high resolution patterned images is described. Chloroalkyl and bromoalkyl acrylate homopolymers and copolymers are especially sensitive. Chlorine is an especially desirable atom to incorporate into the resist polymer because it has a high mass absorption coefficient for X-rays, especially the Pd 4.37 Angstrom $L_\alpha$ characteristic line, and can be incorporated in high weight percents without interfering with the polymer chemistry that causes cross-linking. Preferred chlorinated monomers include 2,3-dichloro-1-propyl acrylate; 1,3-dichloro-2-propyl acrylate; 2chloroethyl acrylate and 2,2,2-trichloroethyl acrylate. A preferred brominated monomer is 2,3-dibromo-1-propyl acrylate. The nonchlorinated or nonbrominated monomer may be essentially any vinyl monomer with acrylic or methacrylic monomers especially preferred. Adequate sensitivity is obtained without any epoxy groups.

DETAILED DESCRIPTION

The described X-ray and electron resists are a class of homopolymers or copolymers of chlorinated or brominated monomers represented by the formula

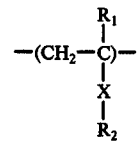

where $R_1$ is H or $CH_3$, X is an optional

substituent and $R_2$ is an alkyl group with the general formula $C_mH_{2n-x+1}Y_x$ where Y is either chlorine or bromine, and $n$ and $x$ are one or greater. To maintain the desirable resist properties of high absorption, ease of preparation and desirable morphology, $n$ is preferably less than 11, and $x$ is equal to or less than $2n + 1$. Halogenated acrylate monomers appear especially useful as X-ray resists because of their sensitivity. Chloroalkyl acrylate monomers of this invention include 2,3-dichloro-1-propyl acrylate; 1,3-dichloro-2-propyl acrylate; 2,2,2 trichloroethyl acrylate and 2-chloroethyl acrylate. A bromoalkyl acrylate monomer of this invention is 2,3-dibromo-1-propyl acrylate. In a copolymer, the nonchlorinated or nonbrominated monomer may be essentially any vinyl monomer. However, acrylic and methacrylic monomers are desirable because of the ease of copolymerization and the resulting resolution and sensitivity of the resist. The precise constituent put on the ester side chain of the methacrylic or acrylic monomer has been found to be not crucial.

A procedure modeled on the procedure described in *J. Polym. Sci., Polym. Chem. Ed.* 10 3125 (1972) for 1,2,2,2 tetrachloroethyl acrylate and methacrylate may be used to prepare the chloroacrylate monomers. The monomers may be prepared by direct esterification with acrylic acid according to the procedure of *Chem. Abst.* 61 13181e (1964) for the preparation of 2-chloroethyl acrylate.

The chlorinated or brominated monomers are dissolved in a solvent to yield a concentration of about 1 to 2 moles/liter. If a copolymer is to be made, another monomer is also added. To maintain adequate sensitivity and contrast, the chlorinated or brominated monomer should be at least 50 percent by weight of the total monomer weight. Suitable solvents for the homopolymer polymerization include acetone and a benzene chloroform mixture with benzene concentration between 0 percent and 75 percent by weight with the remainder chloroform. Suitable solvents for the copolymer polymerization include benzene, chloroform and methyl ethyl ketone. An initiator, such as azobisisobutyronitrile is added to the solution, in amounts between 0.01 percent and 0.60 percent by weight of the monomer. Although the precise ratio of monomer to initiator is not crucial, the presence of too much monomer (too little initiator) leads to a rapid and uncontrolled polymerization at moderate percent conversion. The presence of too little monomer (too much initiator) leads to an undesirably low weight average molecular weight. The weight average molecular weight for X-ray radiation is desirably between 300,000 and 3,000,000. Higher molecular weights make filtering and processing of the polymer difficult and lower molecular weights reduce the polymer sensitivity to undesirably low values. For use as an electron resist, the weight average molecular weight may be lower and a monomer concentration of 0.1 mole to 1 mole per liter may be used.

Polymerization is generally best performed at a temperature between 40° and 50° C although temperatures outside this range can also be used. While the precise temperature is not crucial, lower temperatures lead to higher weight average molecular weights. The preferred dispersity (weight average molecular weight divided by the number average molecular weight) is between 1.7 and 3.0. Controlling the amount of conversion and the use of chain transfer polymerization solvents provide methods for controlling the molecular weight distribution. Details are given in Molecular Weight Distributions in Polymers by L. H. Peebles, Jr., Chap. 2, pp. 48-132, Interscience 1971. If the amount of conversion is limited to less than 50 percent, a satisfactory dispersity is obtained.

The resist should have good adhesive properties with respect to the substrate and the resists described herein have better adhesive properties when used above the glass transition temperature, $T_g$, i.e., when they are in the rubber rather than the glass phase. As a general rule, decreasing the weight percent of chlorinated monomer will decrease the glass transition temperature. 2,3-dichloro-1-propyl acrylate; 1,3-dichloro-2-propyl acrylate; and 2-chloroethyl acrylate homopolymers have glass transition temperatures of 6° C, 20° C and −1° C, respectively and are in the rubber phase at normal processing temperatures. 2,2,2-trichloroethyl acrylate has a glass transition temperature of 49° C and will typically be in the glass phase for processing unless polymerized with another monomer to reduce $T_g$.

Morphology also is important in determining sensitivity with polymers in the glass phase usually being less sensitive than polymers in the rubber phase even though they may have a greater chlorine content by weight percent. This is believed due to reactive intermediate having greater mobility in the rubber phase and thus favoring crosslinking reactions. In the more rigid polymers with a higher $T_g$ recombination processes are favored. The crosslinking efficiency as well as the absorption probability is thus important in determining resist sensitivity.

The resist is put onto a substrate, such as silicon covered with a thin silicon oxide layer, chrome, phosphosilicate glass or aluminum, with conventional spin coating techniques. For all homopolymers and copolymers described, chlorobenzene and 2-methoxyethyl acetate are suitable solvents. For the homopolymer of 2,3-dichloro-1-propyl acrylate; chlorobenzene, cyclopentanone, dioxane, butylacetate and cyclohexanone are suitable solvents. The dry polymer in the solvent, prior to spinning, is normally less than 10 percent by weight. The coated substrate is spun to obtain a resist thickness between 4000 Angstroms and 15,000 Angstroms. After coating, the resist is vacuum baked for 15 to 30 minutes at a temperature between 90° C and 115° C to remove excess solvent.

A patterned mask formed from a material relatively transparent to the X-rays used is placed close, e.g., 40 microns, to the resist covered substrate and exposed to a radiation source such as an X-ray beam from a source typically 50 cm from the mask. The portion of the resist not shadowed by the pattern is exposed to the X-rays and crosslinks. Typical mask materials include polyethylene terephthalate, silicon, KAPTON (Poly[N,N'-(p,p'-oxydiphenylene) pyromellitimide]), and beryllium. Silicon masks are less advantageously used with the polymers of this invention as silicon has a K shell absorption edge at 6.74 Angstroms which limits its usefulness for X-rays of shorter wavelength and, as explained below, chlorine is most advantageously used with X-rays shorter than 4.4 Angstroms. Gold and platinum, because of their high X-ray absorption, are exemplary materials for forming the desired pattern on the mask.

Contrast is also an important resist property as it characterizes the ability of the resist to distinguish between exposed and unexposed areas. For a negative resist, the contrast, $\delta$, is defined as the slope of the linear portion of a plot of the normalized film remaining as a function of log dose. To be suitable as a resist, the polymer should have a $\delta$ of at least 0.7.

The X-rays are produced by a beam of 20 Kev to 30 Kev electrons striking a target. The X-ray spectrum has two components, the continuous and the characteristic. The continuous spectrum is produced by an electron-nucleus interaction in which the electron loses energy and an X-ray is emitted. The characteristic spectrum arises when an incident electron ejects a K or L shell electron from an atom in the target and a transition of an electron from a higher energy state to the vacant state follows with the energy emitted as an X-ray. A high ratio of characteristic to continuous X-rays is desirable as the short wavelength continuous X-rays are not completely absorbed by the mask pattern and cause a loss of contrast as some resist material covered by the pattern is exposed. The efficiency of generation of characteristic X-rays, i.e., emitted characteristic X-ray energy per incident electron, increases with electron energy up to about 30 Kev and then levels off while the efficiency of generation of continuous X-rays between 4 Angstroms and 9 Angstroms is roughly independent of electron energy. 20 Kev to 30 Kev electrons thus give a high ratio of characteristic to continuous X-rays.

For the chlorinated resists described, Pd is an especially efficient target material although other targets can be used. The X-ray absorption of chlorine is large at the wavelength, 4.37 Angstroms, of the PD $L_\alpha$ line although the K shell absorption edge causes the X-ray absorption to drop rapidly immediately above 4.4 Angstroms. The absorption increases again as the wavelength increases and is large at the 8.34 Angstrom line from an Al target. The brominated resists are especially sensitive to the 4.64 Angstrom line from a Rh target.

After exposure to radiation, the exposed polymers crosslink and become relatively insoluble, i.e., less easily removed, with respect to the unexposed polymers with suitable wet development. The precise process leading to crosslinking is believed to be the following. The incident X-rays or electrons are absorbed primarily by chlorine atoms and K shell electrons are ejected, leaving either excited states or free radicals. The ejected or other excited electrons can ionize or be captured by other atoms creating additional excited states or free radicals. The excited states or free radicals crosslink and insolubilize the exposed polymer. Nonchlorinated acrylic or methacrylic monomers have been found especially effective in copolymers, and it is believed that these monomers, as well as the chlorinated monomers, take part in the crosslinking reactions.

Exposure times depend on system details, e.g., the energy actually incident on the resist and the sensitivity and crosslinking efficiency of homopolymer or copolymer. In general, the exposure time needed to produce a given amount of insolubilization decreases with increasing polymer weight average molecular weight because one crosslink per weight average polymer molecule results in insolubilization of more polymer, by weight, than will one cross-link per polymer pair for lower molecular weight polymers. It has been found that for approximately constant dispersity, the resist contrast decreases as the weight average molecular weight increases although this may be partially due to solvent retention. Copolymers with acrylic or methacrylic monomers containing reactive functional groups are more sensitive than those without such groups.

After exposure, the resist is developed, i.e., the unexposed portions are removed, either by spraying or immersion in a suitable developer such as mixtures of methyl ethyl ketone and isopropanol or by suitable dry development techniques. Typical development times are between 10 and 120 seconds with thicker films requiring longer times. After development, the substrate is blown dry and plasma cleaned to remove any residual resist remaining in the masked areas. The now pattern delineated resist and substrate may undergo the further processing entailed in the fabrication of microelectronic devices such as LSI circuits (large scale integration), masks or bubble devices. Several typical processing sequences will be briefly outlined. LSI fabrication typically begins with a semiconductor substrate, such as Si or GaAs, covered with a layer of $SiO_2$ which is coated with a layer of the resist. After patterning the resist, the bared oxide layer is removed, usually, by etching in a buffered HF solution. Dopants may now be put into the bared semiconductor substrate with techniques such as diffusion or ion implantation. If diffusion is used, it has been found desirable to remove the resist prior to diffusion. The $SiO_2$ layer, prevents diffusion in unwanted areas. The remaining resist, if any, now is stripped off and a new oxide layer formed and coated with resist. The processing sequence is now repeated. The last processing sequence usually involves a metal, such as aluminum, which is pattern delineated to provide contacts to and between the circuit elements and components. X-ray mask replication typically uses a mask substrate covered with layers (in order) of Ti, Pt or Au, Ti/Ta and the resist. After the resist has been pattern delineated, the now bared areas of the Ti/Ta layer are removed with plasma etching to expose the Au or Pt layer. The Au or Pt layers are removed by ion milling with the Ti/Ta layer, having a high absorption cross section for the ions acting as a mask. Finally, the Ti layer is removed chemically. Chemical etching of the Au or Pt is less desirable than ion milling because of the resulting undercutting. Other masks have a glass substrate covered with a metal layer and are used in photolithography.

EXAMPLE 1

Poly (2-Chloroethyl Acrylate)

To 33.6g of 2-chloroethyl acrylate were added a 1/1 mixture by volume of benzene and chloroform in a quantity sufficient to make 250 ml and 0.25g of azo-bis-isobutyronitrile. The mixture was bubbled with argon and heated for 4 hours at 40° C. The polymer was precipitated by adding the solution to hexane. The white polymer precipitate was purified by reprecipitation into hexane. The precipitate was dried at 25° C under vacuum to give 12.3g (36.6%) of dry polymer. The weight average molecular weight was 448,000 and the dispersity was 2.79 as measured by gel permeation chromatography. A propyl acetate solution was used to spin coat a silicon wafer. The coated substrate was exposed to X-rays emitted from a Pd target and required a dose of 27 mJ/cm$^2$, after development and drying in vacuum, to cause crosslinking to 50 percent of the initial film thickness. With an initial resist thickness of 6000 to 7000 Angstroms, exposure through a 7000 Angstrom thick gold pattern can resolve 1 micron lines and spaces.

EXAMPLE 2

Poly (1,3-Dichloro-2-Propyl Acrylate)

To 18.3g of 1,3-dichloro-2-propyl acrylate were added a 1/1 mixture by volume of benzene and chloroform in a quantity sufficient to make 100 ml and 100 mg of azo-bis-isobutyronitrile. The mixture was bubbled with argon and heated for 5 hours at 40° C. The polymer was precipitated by addition of the solution to methanol. The polymer precipitate was dissolved in methyl ethyl ketone and reprecipitated in methanol. The white precipitate was dried at 25 degrees C under vacuum to give 9.5g (52%) of polymer. The weight average molecular weight was 819,000 and the dispersity was 2.43 as determined by gel permeation chromatography. A solution of the polymer in 2-methoxyethyl acetate was used to spin coat a silicon wafer. The coated substrate was exposed to X-rays emitted from a Pd target and required a dose of 39 mJ/cm$^2$ after development and drying in vacuum to cause crosslinking to 50 percent of the initial film thickness. With an initial resist thickness of 6000 to 7000 Angstroms, exposure through a 7000 Angstrom thick gold pattern can resolve 1 micron lines and spaces.

EXAMPLE 3

Poly (2,3-Dichloro-1-Propyl Acrylate)

To 18.3g of 2,3-dichloro-1-propyl acrylate were added a 1/1 mixture by volume of benzene and chloroform in a quantity sufficient to make 100 ml and 100 mg of azo-bis-isobutyronitrile. The mixture was bubbled with argon and heated for 6 hours at 40° C. The polymer was precipitated by adding the solution to methanol. The precipitate was dissolved in methyl ethyl ketone and reprecipitated by addition of the solution to methanol. The white precipitate was dried at 25° C under vacuum to give 5.0g (27%) of polymer. The weight average molecular weight was 524,000 and the dispersity was 2.0 as determined by gel permeation chromatography. A 2-methoxyethyl acetate solution was used to spin coat a silicon wafer. The coated substrate was exposed to X-rays emitted from a Pd target and required a dose of 13 mJ/cm$^2$ after development and drying in a vacuum to cause crosslinking to 50 percent of the initial film thickness. A similarly prepared sample when exposed to a 10 keV beam of electrons required a dose of 1.1 × 10$^{-7}$ C/cm$^2$ to cause crosslinking to 50 percent of the initial film thickness. With an initial resist thickness of 6000 to 7000 Angstroms, exposure through a 7000 Angstrom thick gold pattern can resolve 1 micron lines and spaces.

EXAMPLE 4

Poly (2,2,2-Trichloroethyl Acrylate)

To 20.4g of 2,2,2-trichloroethyl acrylate were added a 1/1 mixture by volume of benzene and chloroform in a quantity sufficient to make 100 ml and 100 mg of azo-bis-isobutyronitrile. The mixture was bubbled with argon and heated at 40° C for 5 hours. The polymer was precipitated by addition of the solution to methanol. The precipitate was dissolved in methyl ethyl ketone and reprecipitated by addition to methanol. The white precipitate was dried under vacuum to give 5.1g (25%) of a brittle white solid. The weight average molecular weight was 876,000 and the dispersity was 2.09 as determined by gel permeation chromatography. A 2-methoxyethyl acetate solution was used to spin coat a silicon wafer. The coated substrate was exposed to X-rays emitted from a Pd target and required a dose of 44 mJ/cm$^2$ after development and drying in a vacuum to cause crosslinking to 50 percent of the initial film thickness. With an initial resist thickness of 6000 to 7000 Angstroms, exposure through a 7000 Angstrom thick gold pattern can resolve 1 micron lines and spaces.

EXAMPLE 5

Poly (2,3-Dibromo-1-Propyl Acrylate)

To 27.3g of 2,3-dibromo-1-propyl acrylate were added a 1/3 by volume mixture of benzene and methyl ethyl ketone in a quantity sufficient to make 100 ml and 20 mg of azo-bis-isobutyronitrile. The solution was bubbled with argon and was heated at 50° C for 6 hours. The polymer was precipitated by addition to isopropanol. The precipitate was dissolved in methyl ethyl ketone and reprecipitated by addition to isopropanol. The white precipitate was dried under vacuum to give 15.2g (56%) polymer. The weight average molecular weight was 312,000 and the dispersity was 2.71 as determined by gel permeation chromatography. A cyclohexanone solution was used to spin coat a silicon wafer. The coated substrate was exposed to X-rays emitted from a Rh target and required a dose of 350 mJ/cm$^2$ to cause crosslinking to 50 percent of the initial film thickness. With an initial resist thickness of 6000 to 7000 Angstroms, exposure through a 7000 Angstrom thick gold pattern can resolve 1 micron lines and spaces.

What is claimed is:

1. Article comprising a substrate coated with a radiation sensitive material, characterized in that said material consists essentially of a polymer prepared from a first monomer selected from the group consisting of monomers represented by the formula

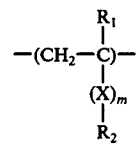

where R$_1$ is selected from the group consisting of H and CH$_3$, X is

and $m$ is 0 or 1, and R$_2$ is an alkyl group with the formula C$_n$H$_{2n-x+1}$Y$_x$ where $n$ and $x$ are equal to or greater than one, $x$ is equal to or less than $2n + 1$, and Y is selected from the group consisting of chlorine and bromine, together with a second monomer said second monomer being a vinyl monomer, said first monomer forming between 50 percent and 100 percent by weight, of the polymer.

2. Article as recited in claim 1 in which said first monomer is an acrylate.

3. Article as recited in claim 2 in which said first monomer is 2,3-dibromo-1-propyl acrylate.

4. Article as recited in claim 2 in which said first monomer is selected from the group consisting of 2,3-dichloro-1-propyl acrylate; 1-3-dichloro-2-propyl acrylate; 2,2,2-trichloroethyl acrylate and 2-chloroethyl acrylate.

5. Article as recited in claim 1 in which said vinyl monomer is selected from the group consisting of acrylic and methacrylic monomers.

6. Article as recited in claim 4 in which said material is sensitive to X-ray radiation consisting primarily of approximately 4.37 Angstrom X-rays.

7. Article as recited in claim 1 in which said weight percent of said first monomer is essentially 100 percent.

8. Article as recited in claim 1 in which said polymer has a dispersity between 1.7 and 3.0.

9. Article as recited in claim 1 in which said substrate consists essentially of a semiconductor.

10. Article as recited in claim 9 in which said semiconductor consists essentially of silicon.

11. Article as recited in claim 1 in which said substrate consists essentially of a semiconductor covered by a layer of silicon oxide.

12. Article as recited in claim 11 in which said semiconductor consists essentially of silicon.

13. Article as recited in claim 1 in which said substrate has a mask substrate of radiation transparent material covered by a metal layer.

14. Article as recited in claim 13 in which said mask substrate is selected from the group consisting of polyethylene terephthalate, silicon, poly[N,N'-(p,p'-oxydiphenylene)pyromellitimide] and beryllium.

15. Article as recited in claim 14 in which said metal is selected from the group consisting of Au and Pt.

16. Article as recited in claim 13 in which said mask substrate is glass.

17. Article as recited in claim 16 in which said metal is chrome.

18. Process for pattern delineating a substrate coated with a negative resist material comprising the steps of
exposing selected portions of said resist material to radiation which causes said exposed portions to become less easily removable with respect to the unexposed portions, in which said resist consists essentially of a polymer;
removing the unexposed portions; and
processing the pattern delineated resist and substrate with processing steps that alter the bared substrate areas, characterized in that said polymer consists essentially of a polymer prepared from a first monomer selected from the group consisting of monomers represented by the formula

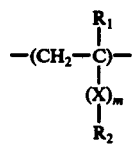

where $R_1$ is selected from the group consisting of H and $CH_3$, X is

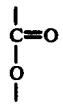

and m is 0 or 1, and $R_2$ is an alkyl group with the formula $C_nH_{2n-x+1}Y_x$ where n and x are equal to or greater than one, x is equal to or less than $2n+1$, and Y is selected from the group consisting of chlorine and bromine, together with a second monomer, said second monomer being a vinyl monomer, said first monomer forming between 50 percent and 100 percent by weight of the polymer.

19. Process of claim 18 in which said processing results in the deposition of material on bared portions of the substrate.

20. Process of claim 19 in which said substrate consists essentially of a semiconductor.

21. Process of claim 20 in which said deposition is by ion implantation.

22. Process of claim 20 in which the deposited material is diffused into said substrate.

23. Process of claim 18 in which said processing results in removal of a layer of the bared substrate.

24. Process of claim 23 in which said layer consists essentially of silicon oxide.

25. Process of claim 24 in which said layer of silicon oxide covers a semiconducting substrate.

26. Process of claim 25 in which said semiconducting substrate consists essentially of silicon.

27. Process of claim 23 in which said processing further results in the deposition of material on said bared portions of said substrate.

28. Process of claim 27 in which the deposited material is diffused into said substrate.

29. Process of claim 27 in which said deposition is by ion implantation.

30. Process of claim 27 in which said bared portion consists essentially of a semiconductor.

31. Process of claim 30 in which said semiconductor consists essentially of silicon.

32. Process of claim 23 further comrpising repeating the exposing, removing and processing steps.

33. Process of claim 32 in which at least one of said layers consists essentially of a metal.

34. Process of claim 27 further comprising repeating the exposing, removing and processing steps.

35. Process of claim 27 in which said processing further includes deposition of a metal layer on said substrate.

36. Process of claim 35 in which portions of said metal layer are selectively removed.

37. Process of claim 18 in which said processing results in the removal of material on bared portions of said substrate.

38. Process of claim 37 in which said removal is by ion milling.

39. Process of claim 37 in which said substrate consists essentially of a metal.

40. Process of claim 39 in which said metal is selected from the group consisting of Au and Pt.

41. Process of claim 40 in which said removal is by ion milling.

* * * * *